United States Patent
Avoyan et al.

(10) Patent No.: US 8,022,718 B2
(45) Date of Patent: Sep. 20, 2011

(54) METHOD FOR INSPECTING ELECTROSTATIC CHUCKS WITH KELVIN PROBE ANALYSIS

(75) Inventors: Armen Avoyan, Glendale, CA (US); Hong Shih, Walnut, CA (US); John Daugherty, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 125 days.

(21) Appl. No.: 12/392,498

(22) Filed: Feb. 25, 2009

(65) Prior Publication Data

US 2010/0045316 A1 Feb. 25, 2010

Related U.S. Application Data

(60) Provisional application No. 61/064,378, filed on Feb. 29, 2008.

(51) Int. Cl.
*G01R 31/20* (2006.01)

(52) U.S. Cl. ......... 324/754.05; 324/754.21; 324/754.19; 382/154; 356/12

(58) Field of Classification Search .................. 250/306; 382/149, 181; 324/754.05, 754.21
See application file for complete search history.

(56) References Cited

U.S. PATENT DOCUMENTS

| | | | |
|---|---|---|---|
| 3,473,875 A * | 10/1969 | Bertram | 356/2 |
| 5,117,121 A * | 5/1992 | Watanabe et al. | 307/130 |
| 5,917,327 A * | 6/1999 | Haley et al. | 324/457 |
| 5,993,615 A | 11/1999 | Abry et al. | |
| 6,162,332 A | 12/2000 | Chiu | |
| 6,163,448 A * | 12/2000 | Hausmann | 361/234 |
| 6,265,890 B1 | 7/2001 | Chacon et al. | |
| 6,332,961 B1 | 12/2001 | Johnson et al. | |
| 6,447,937 B1 * | 9/2002 | Murakawa et al. | 428/696 |
| 6,452,411 B1 * | 9/2002 | Miller et al. | 324/765 |
| 6,529,362 B2 * | 3/2003 | Herchen | 361/234 |
| 6,535,785 B2 | 3/2003 | Johnson et al. | |
| 6,669,783 B2 | 12/2003 | Sexton et al. | |
| 6,736,944 B2 | 5/2004 | Buda | |
| 6,853,953 B2 * | 2/2005 | Brcka et al. | 702/182 |
| 6,957,154 B2 | 10/2005 | Steele et al. | |
| 7,035,768 B2 | 4/2006 | Matsuda | |
| 7,052,553 B1 | 5/2006 | Shih et al. | |
| 7,199,327 B2 | 4/2007 | Morozet et al. | |
| 7,230,443 B1 * | 6/2007 | Fung et al. | 324/765 |
| 7,262,606 B2 | 8/2007 | Axenbeck et al. | |
| 7,292,045 B2 | 11/2007 | Anwar et al. | |
| 7,301,286 B2 | 11/2007 | Kuriyama | |
| 7,305,311 B2 | 12/2007 | van Zyl | |
| 7,313,451 B2 * | 12/2007 | Takayama et al. | 700/90 |
| 7,508,977 B2 * | 3/2009 | Lyons et al. | 382/154 |

(Continued)

OTHER PUBLICATIONS

U.S. Appl. No. 11/289,313, filed Nov. 30, 2005.

(Continued)

*Primary Examiner* — Huy Phan
*Assistant Examiner* — Richard Isla Rodas
(74) *Attorney, Agent, or Firm* — Buchanan Ingersoll & Rooney PC

(57) ABSTRACT

A method of inspecting an electrostatic chuck (ESC) is provided. The ESC has a dielectric support surface for a semiconductor wafer. The dielectric support surface is scanned with a Kelvin probe to obtain a surface potential map. The surface potential map is compared with a reference Kelvin probe surface potential map to determine if the ESC passes inspection.

11 Claims, 5 Drawing Sheets

U.S. PATENT DOCUMENTS

| | | | |
|---|---|---|---|
| 7,586,166 B2 * | 9/2009 | Bonnell et al. | 257/428 |
| 2007/0126458 A1 * | 6/2007 | Shi et al. | 324/765 |
| 2007/0195482 A1 * | 8/2007 | Muka et al. | 361/234 |
| 2007/0284246 A1 | 12/2007 | Keil et al. | |

OTHER PUBLICATIONS

International Search Report and Written Opinion mailed Oct. 6, 2009 for PCT/US2009/001224.

* cited by examiner

METHOD FOR INSPECTING ELECTROSTATIC CHUCKS WITH KELVIN PROBE ANALYSIS

CROSS-REFERENCE TO RELATED APPLICATIONS

This application claims priority under 35 U.S.C.§119 to U.S. Provisional Application No. 61/064,378 entitled METHOD FOR INSPECTING ELECTROSTATIC CHUCKS WITH KELVIN PROBE ANALYSIS and filed on Feb. 29, 2008, the entire content of which is hereby incorporated by reference.

BACKGROUND

An electrostatic chuck (ESC), a component of semiconductor processing equipment such as plasma etch chambers, can be used for transporting, holding and/or temperature control of a semiconductor wafer or glass substrate (i.e., flat panel display) during processing, for example, in a chemical vapor deposition (CVD), physical vapor deposition (PVD), or etch reactor. ESCs often exhibit short lifetimes resulting in failures including, for example, dynamic alignment failure, high leakage of helium cooling gas between the ESC and the underside of a supported substrate, increased dechucking time, and sticking of the substrate to the ESC or dechucking failure. The early failure of ESCs can cause substrate breakage, impact throughput, lead to particle and defect issues, and increase ownership costs of plasma processing equipment incorporating such ESCs.

SUMMARY

A method of inspecting an electrostatic chuck (ESC) is provided. The ESC has a dielectric support surface for a semiconductor wafer. The dielectric support surface is scanned with a Kelvin probe to obtain a surface potential map. The surface potential map is compared with a reference Kelvin probe surface potential map to determine if the ESC passes inspection.

DETAILED DESCRIPTION

Figure 1A:
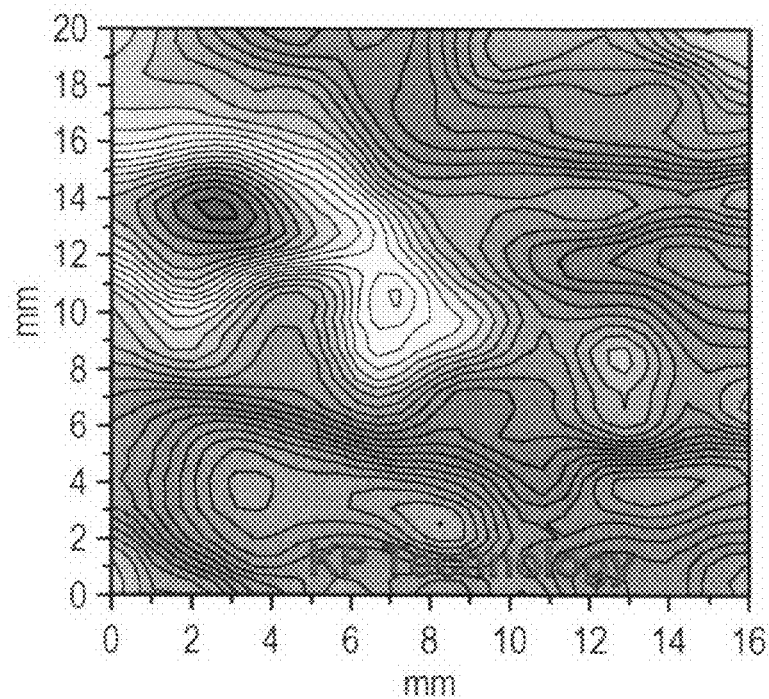
FIGS. 1A, 1B, 2A, 2B, 3A and 3B illustrate exemplary Kelvin probe surface potential mapping of three ESC dielectric surfaces.

ESCs can be used in dielectric etch processes such as plasma etching silicon oxide and low-k materials. An exemplary dielectric ESC can comprise a metal base (e.g., anodized or non-anodized aluminum alloy) with a dielectric surface on which a semiconductor or substrate such as a wafer is supported. As an example, the dielectric surface may comprise a sintered laminate comprising a patterned refractory (e.g., tungsten or molybdenum) electrode between two ceramic layers (e.g., thin ceramic layers approximately 20 mils thick). The laminate may be bonded to the metal base with a bonding material such as a silicone based material containing conductive powders (e.g., aluminum, silicon, or the like). The metal base, approximately 1.5 inches thick, typically includes RF and DC power feeds, through holes for lift pins, helium gas passages, channels for temperature controlled fluid circulation, temperature sensing arrangements, and the like.

A bipolar ESC includes a plurality of electrodes (e.g., interdigitated, concentric rings, etc.), each electrode charged with opposite voltages to maintain clamping ability in the absence of a plasma. In one embodiment, an outer electrode of the ESC is positively charged. For the bipolar ESC, one of the electrodes has a positive charge, whereas the other electrode has a negative charge.

ESCs are typically either Coulombic or Johnsen-Rahbek type. Coulombic type ESCs use a dielectric surface layer having a higher electrical resistance to generate Coulombic electrostatic forces. Johnsen-Rahbek type ESCs, which often provide higher electrostatic clamping forces for a lower applied voltage, utilize lower resistance dielectric surface layers such as $Al_2O_3$ doped with, for example, $TiO_2$.

According to an embodiment, the ceramic dielectric layer of a Johnsen-Rahbek type ESC may comprise 94% $Al_2O_3$, 4% $SiO_2$, 1% $TiO_2$, and 1% CaO (weight %) as well as trace amounts of MgO, Si, Ti, Ca, and Mg. According to another embodiment, for a Coulombic type ESC, the ceramic dielectric layer may comprise greater than or equal to 99% $Al_2O_3$.

Currently, methods of inspecting ESCs, both new and reconditioned, include current-voltage characterization of the ESC and the helium flow endpoint test. Both of these inspection methods involve installing the ESC in a plasma processing apparatus and consuming multiple blank test wafers (e.g., about 10 to 20 silicon wafers).

For current-voltage characterization of a bipolar ESC, a blank test wafer is placed on the ESC and a plasma is generated. The ESC current is measured as a function of voltage (i.e., up to 2000 V) to generate current-voltage profiles for both the negative electrodes and the positive electrodes. At lower voltages, the current-voltage profiles are substantially parallel, with the current from the negative electrode being lower than the current from the positive electrode. However, at some higher voltage, the current from the negative electrode sharply increases and crosses the current from the positive electrode (i.e., "crossing voltage"). Current-voltage characterization is repeated for a plurality of wafers, in which multiple values of crossing voltage are determined.

It is believed that the current from the positive electrode remains relatively flat, due to the outermost electrode being positive, which is likely to leak current into the plasma. On the other hand, the current from the negative electrode is believed to sharply increase due to field emission or Shottky emission effects. Generally, an ESC with a higher crossing voltage exhibits improved clamping characteristics relative to an ESC with a low crossing voltage.

For the helium flow endpoint test, a blank test wafer is placed on the ESC. A voltage is applied to the ESC to clamp the blank wafer while a plasma is generated. After completion of the plasma processing, helium flow is initiated along the backside of the wafer (i.e., the surface contacting the ESC) at a predetermined flow rate to facilitate dechucking of the wafer. Simultaneously, a low power plasma is generated (i.e., less than 100 W) to remove the remaining charge from the wafer. During the helium flow endpoint test, the total time for helium flow until dechucking has been completed is measured. Generally, an ESC with shorter helium flow time exhibits improved clamping and dechucking characteristics relative to an ESC with a longer helium flow time.

However, both of these inspection methods are time consuming, labor-intensive and can potentially produce inconsistent results. Current inspection methods require the installation of the ESC in a plasma processing apparatus, evacuation of the apparatus and the generation of a plasma. Furthermore, these inspection methods are repeated for multiple iterations, requiring the additional expenditure of a new blank silicon wafer for each iteration (i.e., 10 to 20 silicon wafers). Moreover, the wafer-to-wafer variation in the properties of blank silicon wafers may result in either inconsistent crossing voltage or helium flow time data. Thus, a need exists for a more cost-effective and reliable inspection method of ESCs.

A novel approach for a cost-effective, reliable method of inspecting ESCs (both new and reconditioned) includes Kelvin probe analysis of the dielectric surface of the ESC which supports the silicon wafer. The Kelvin probe is a nondestructive, non-contact analytical method for characterizing work function (for metals) or surface potential (for dielectrics). This surface analytical technique is based on a vibrating capacitor tip that measures the surface potential between the tip and a sample (e.g., the dielectric surface of an ESC). The amplitude of the vibrations can be adjusted from several microns to several millimeters. The Kelvin probe tip can be rastered in a plane parallel to the upper dielectric surface of the ESC to map the surface potential of areas on the order of inches. Such Kevin probes are available from KP Technology, located in Caithness, United Kingdom.

Figure 1B:
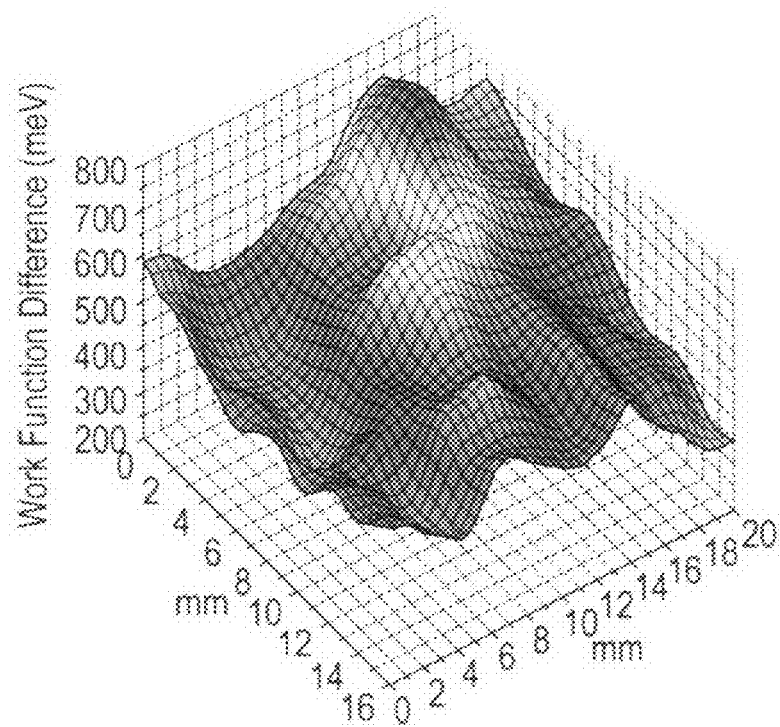
Figure 2A:
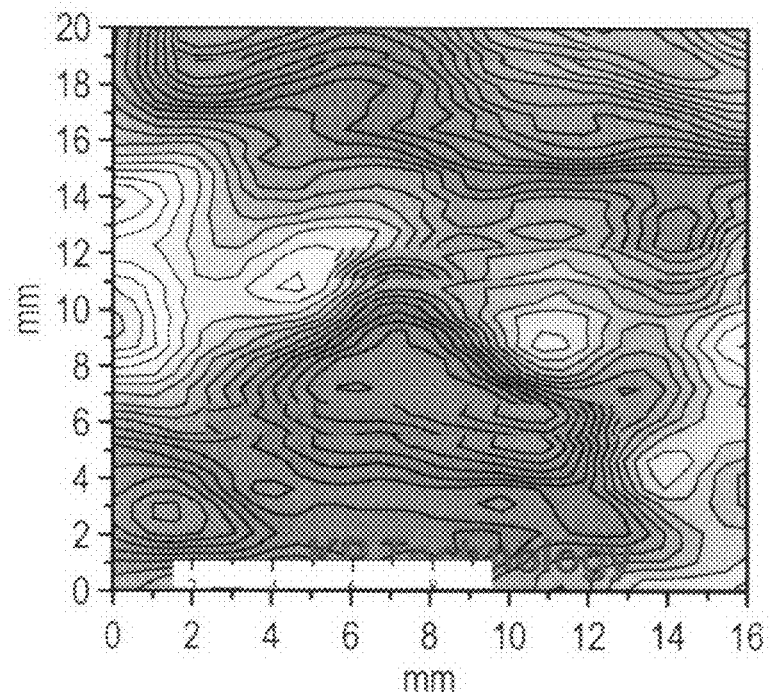
Figure 2B:
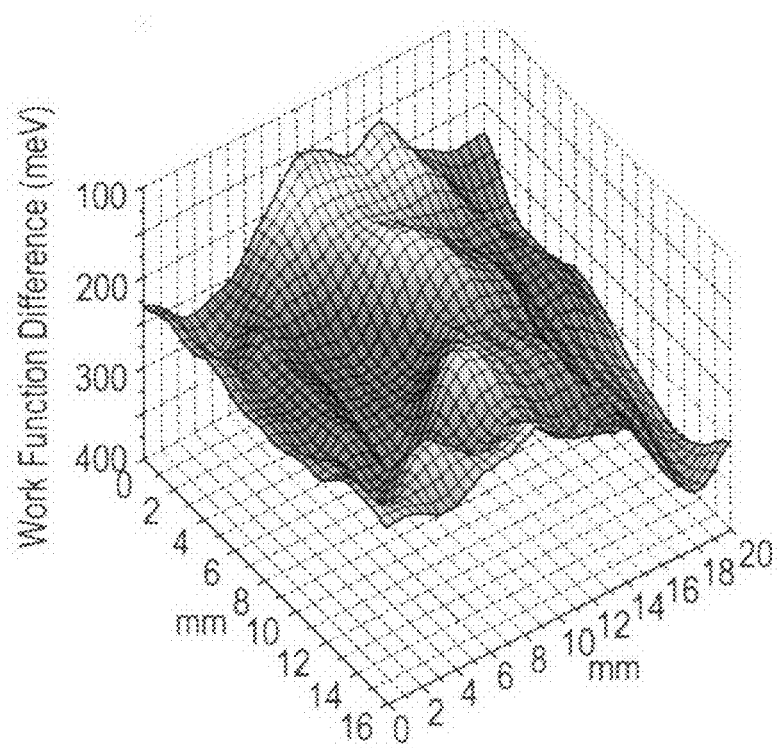
Figure 3A:
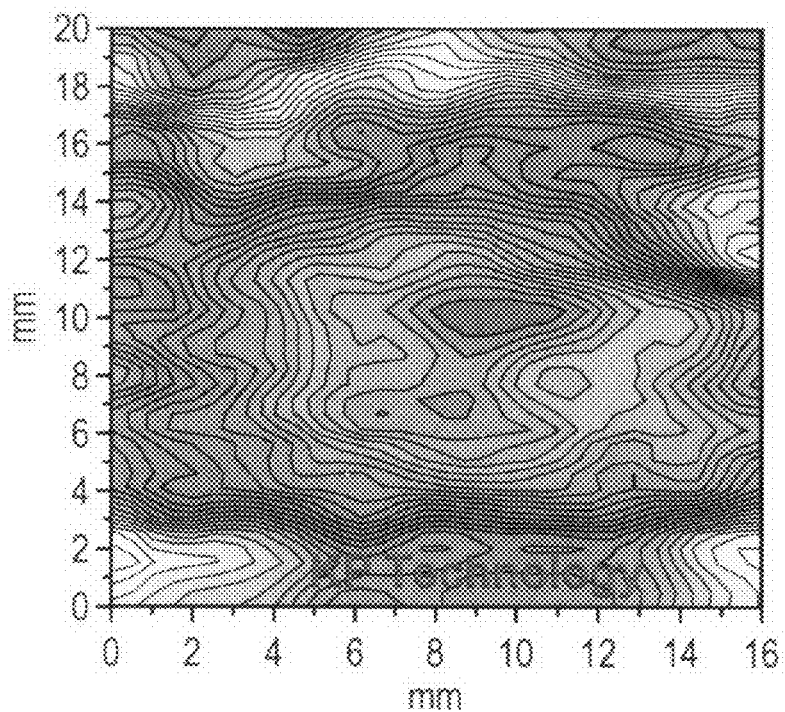
Figure 3B:
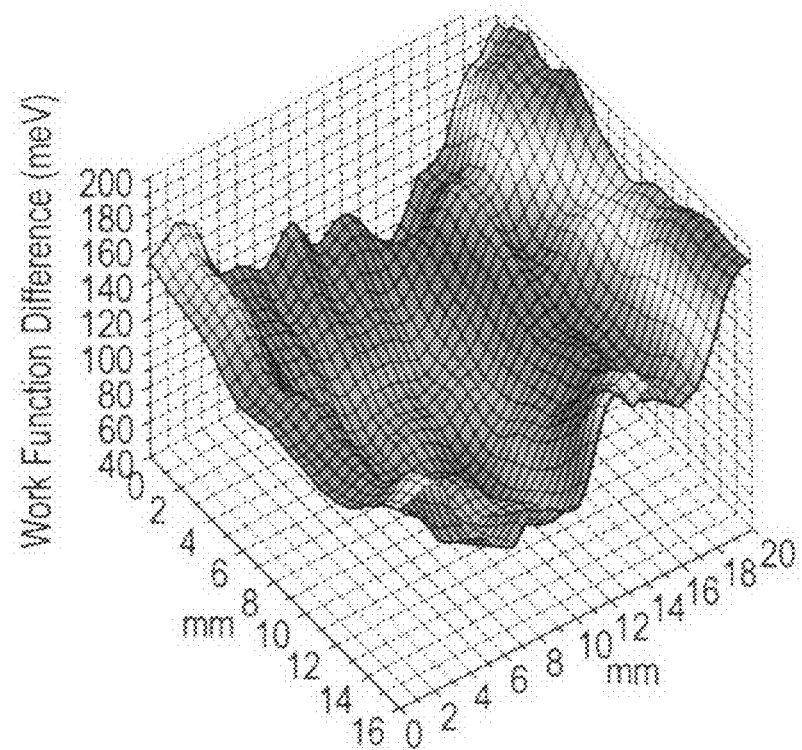

FIGS. 1A, 1B, 2A, 2B, 3A and 3B illustrate three exemplary Kelvin probe surface potential mapping of three ESC dielectric surfaces, across an approximate area of 18 cm×20 cm. FIG. 1A is a two-dimensional contour of a first ESC dielectric surface, in which the surface potential was measured at 523±87 meV. FIG. 1B is a three-dimensional prospective view of FIG. 1A. FIG. 2A is a two-dimensional contour of a second ESC dielectric surface, in which the surface potential was measured at −240±38 meV. FIG. 2B is a three-dimensional prospective view of FIG. 2A. FIG. 3A is a two-dimensional contour of a third ESC dielectric surface, in which the surface potential was measured at 118±33 meV. FIG. 3B is a three-dimensional prospective view of FIG. 3A. Kelvin probe analysis uniquely characterizes ESC surface properties defined by surface morphology and impurity banding within the topmost atomic layer. The characterization of the surface potential of the dielectric surface of an ESC, which can be correlated to clamping characteristics, can be a powerful inspection tool for ESCs. Ideally, the dielectric surface of an ESC would have a uniform and relatively low surface potential, to facilitate the removal of electron charge buildup.

According to a preferred method, a library of reference Kelvin probe surface potential maps is stored in an electronic database. These reference maps are obtained by generating a series of surface potential maps based on Kelvin probe analysis from ESCs that have previously passed inspection and determined to have good clamping and dechucking characteristics (i.e., higher crossing voltage and/or shorter helium flow time). To quickly and cost effectively inspect a new or reconditioned ESC with unknown clamping and dechucking characteristics, a measured Kelvin probe surface potential map for this ESC is generated and compared with the library of reference surface potential maps. If the measured Kelvin probe surface potential map of the new or reconditioned ESC is similar to a reference map in the library, then this ESC passes inspection and is expected to have good clamping and dechucking characteristics. Thus, Kevin probe analysis offers the advantage of inspecting each ESC under ambient conditions without the requirement of installing the ESC in a plasma processing apparatus or expending multiple silicon wafers.

In one embodiment, the measured Kelvin probe surface potential map and the library of reference Kelvin probe surface potential maps are stored on a computer-readable storage medium. The comparison of the measured Kelvin probe surface potential map to the library of reference Kelvin probe surface potential maps can be automated by executing a computer software program. The results of this automated comparison can be issued as a status report, indicating whether the ESC has passed inspection or not. Such methods for comparing measured data to reference data are also disclosed, for example, in commonly-owned U.S. Patent Application Publication No. 2007/0284246 (Keil et al.), which is incorporated herein by reference in its entirety.

EXAMPLE

Tests were performed on two sample ESCs to determine the capability of Kelvin probe analysis as a viable inspection technique. One ESC was previously determined using current-voltage characterization to have passed inspection (ESC Sample No. LJ4030749); the other ESC was previously determined to have failed inspection (ESC Sample No. LJ4030745). Surface potential scans of sample ESCs were performed using Kevin probe Model No. SKP250250, available from KP Technology, located in Caithness, United Kingdom.

The surface of each ESC was scanned with a 10 mm diameter stainless steel tip using a non-contact mode. The stainless steel tip was rastered across an approximate surface area of 180 mm×160 mm. During the scan, each ESC was in electrical contact with an underlying stainless steel substrate. Kelvin probe scans for each sample were repeated three times at different time durations (i.e., up to 1 hour between measurements) to allow for the surface of the ESC to discharge. It should be noted that a slow rate of ESC discharge is a negative characteristic, which results in a longer dechucking time.

Figure 4A:
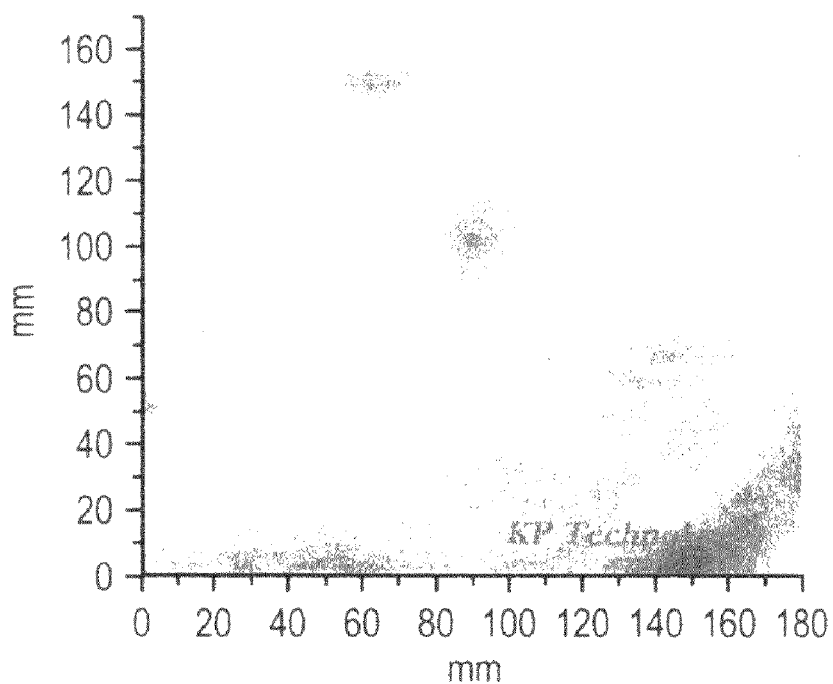
FIGS. 4A and 4B illustrate Kelvin probe surface potential mapping for an ESC chuck which has passed inspection.
Figure 4B:
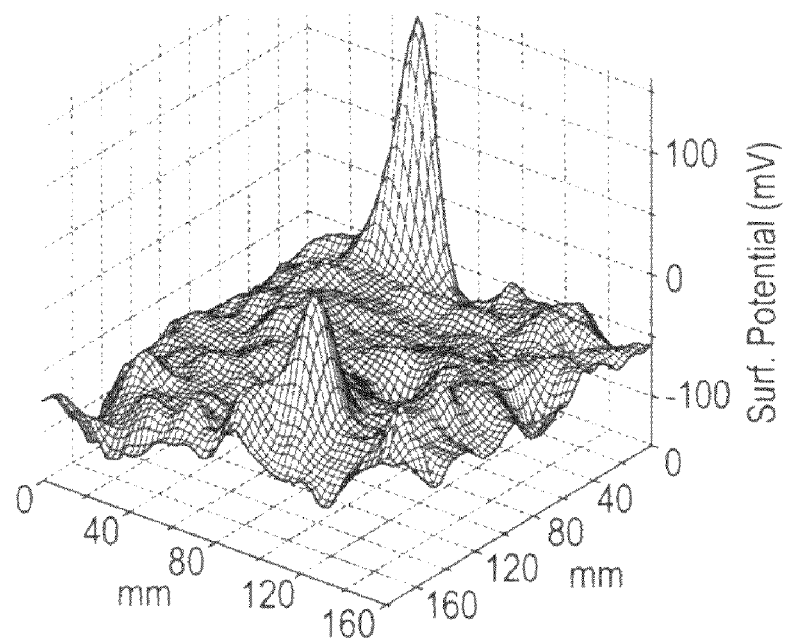
Figure 5A:
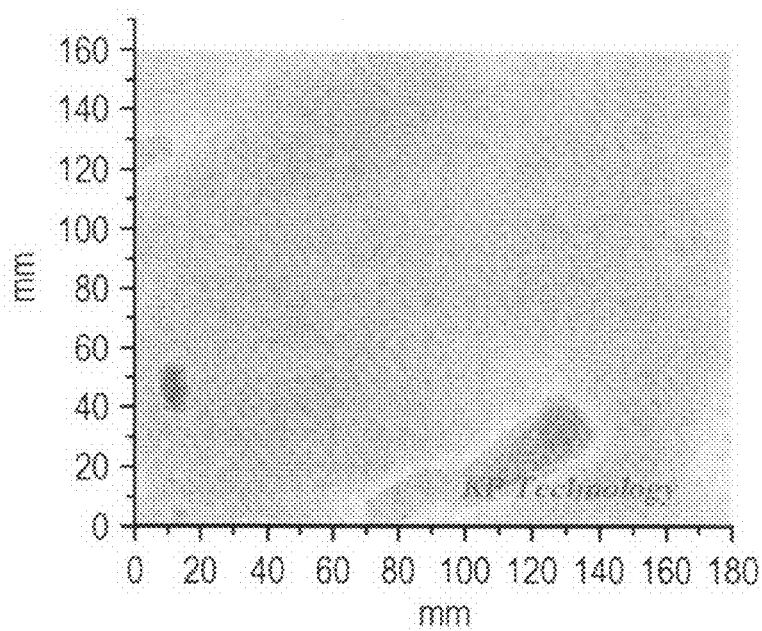
FIGS. 5A and 5B illustrate Kelvin probe surface potential mapping for an ESC chuck which has failed inspection.
Figure 5B:
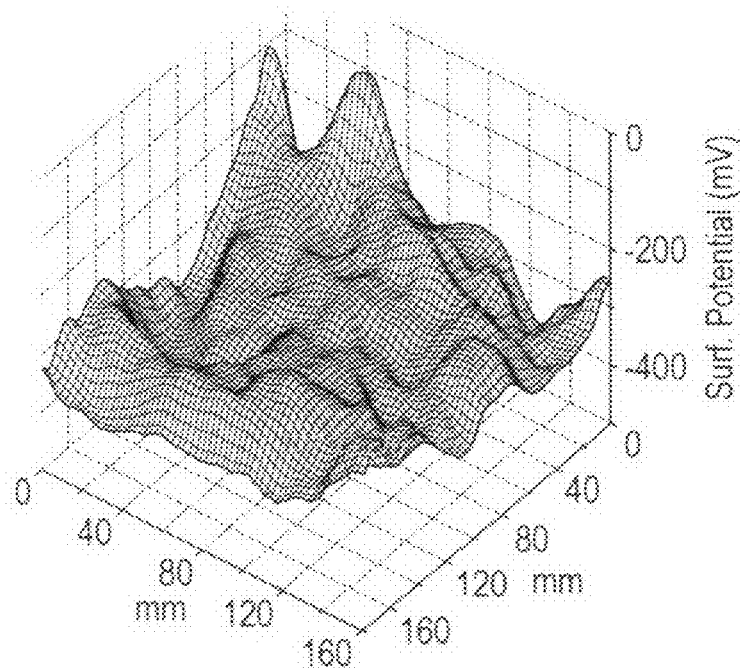

The results of Kelvin probe scans and corresponding crossing voltage are summarized below in TABLE 1. FIG. 4A illustrates a two-dimensional contour surface potential mapping for an ESC chuck which has passed inspection. FIG. 4B is a three-dimensional prospective view of FIG. 4A. FIG. 5A illustrates a two-dimensional contour of surface potential mapping for an ESC chuck which has failed inspection. FIG. 5B is a three-dimensional prospective view of FIG. 5A.

TABLE 1

| ESC Sample No. | Kelvin Probe Scan | | Crossing Voltage | Comment |
| | Surface Potential (mV) | Standard Deviation (mV) | | |
| --- | --- | --- | --- | --- |
| LJ4030749 | −55 | 22 | 650 | Passes Inspection |
| LJ4030745 | −290 | 46 | 200 | Fails Inspection |

The preferred embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of inspecting an electrostatic chuck (ESC), the ESC having a dielectric support surface for a semiconductor wafer, the method comprising:

scanning the dielectric support surface with a Kelvin probe to obtain a three dimensional electrical surface potential map, the scanning being performed by rastering the Kelvin probe in a plane parallel to the dielectric support surface and mapping the surface potential at a plurality of points across an area of the dielectric support surface; and comparing the surface potential map with a reference Kelvin probe surface potential map to determine if the ESC passes inspection.

2. The method of claim 1, wherein the ESC is new or reconditioned.

3. The method of claim 1, wherein the reference Kelvin probe surface potential map is generated by scanning a reference dielectric support surface of an ESC with the Kelvin probe.

4. The method of claim 1, wherein the ESC is a Coulombic or a Johnsen-Rahbek ESC.

5. The method of claim 1, wherein the dielectric support surface is composed of $Al_2O_3$.

6. The method of claim 1, wherein the ESC is a Johnsen-Rahbek ESC; and the dielectric support surface is composed of 94% $Al_2O_3$, 4% $SiO_2$, 1% $TiO_2$ and 1% CaO.

7. The method of claim 1, wherein the ESC is a Coulombic ESC; and the dielectric support surface is composed of greater than or equal to 99% $Al_2O_3$.

8. The method of claim 1, wherein the ESC further comprises a metal base, the dielectric support surface overlying the metal base.

9. The method of claim 8, wherein the metal base comprises RF and DC power feeds, through holes for lift pins, helium gas passages, channels for temperature controlled fluid circulation and temperature sensing arrangements.

10. The method of claim 1, wherein the dielectric support surface comprises a sintered laminate comprising a patterned refractory electrode between two dielectric layers.

11. The method of claim 1, wherein the scanning is performed under ambient conditions.

* * * * *